United States Patent [19]

Yanaka et al.

[11] 4,316,087
[45] Feb. 16, 1982

[54] METHOD OF PHOTOGRAPHING ELECTRON MICROSCOPE IMAGES ON A SINGLE PHOTOGRAPHIC PLATE AND APPARATUS THEREFOR

[75] Inventors: Takashi Yanaka, Hino; Kohei Shirota, Akikawa, both of Japan

[73] Assignee: International Precision Incorporated, Hachiohji, Japan

[21] Appl. No.: 89,371

[22] Filed: Oct. 30, 1979

[30] Foreign Application Priority Data

Nov. 1, 1978 [JP] Japan ................................ 53-133774

[51] Int. Cl.³ ............................................ G01N 23/00
[52] U.S. Cl. ..................................... 250/307; 250/311
[58] Field of Search ............... 250/306, 307, 311, 397, 250/327, 442, 359; 313/361

[56] References Cited

U.S. PATENT DOCUMENTS

| | | | |
|---|---|---|---|
| 3,225,192 | 12/1965 | Katagiri et al. | 250/311 |
| 3,719,776 | 3/1973 | Fujiyasu et al. | 250/311 |
| 3,774,042 | 11/1973 | Engel | 250/311 |
| 4,031,390 | 6/1977 | Müller et al. | 250/307 |
| 4,139,668 | 2/1979 | Ward | 250/311 |

Primary Examiner—Bruce C. Anderson
Attorney, Agent, or Firm—Lane, Aitken, Kice & Kananen

[57] ABSTRACT

This invention relates to a method and apparatus for obtaining a single photograph of electron microscope images, with low gain in magnification, of relatively thick specimen, which photograph is suitable for direct comparison with a corresponding photograph of the same specimen obtained with an optical microscope: wherein either the specimen or the electron beam is so manipulated that the electron beam passes discretely and stepwisely through sequential portions of the specimen, and prior to impinging on the photographic plate the electron beam is screened to eliminate any portion thereof which would produce aberrations or other distortion and is controllably directed to impinge on a portion of the photographic plate which corresponds to the portion of the specimen through which the beam is passing.

9 Claims, 8 Drawing Figures

METHOD OF PHOTOGRAPHING ELECTRON MICROSCOPE IMAGES ON A SINGLE PHOTOGRAPHIC PLATE AND APPARATUS THEREFOR

FIELD OF THE INVENTION

This invention relates to a method of photographing electron microscope images of different portions of a specimen on corresponding portions of a single photographic plate, and apparatus therefor.

BACKGROUND OF THE INVENTION

Heretofore, little attention has been given to the formation of low magnification photographic images with electron microscope. However there is a growing demand to be able to compare the image of a specimen obtained with an optical microscope, which has therefore a relatively low magnification and wide field of view, with a corresponding image obtained with an electron microscope. In order to obtain the latter image it is necessary to use, in the electron microscope, a relatively thick specimen of the nature suitable for optical microscope. However, it is very difficult with a conventional electron microscope to produce an image of uniform high quality on a photographic plate, even if the specimen to be examined is ultra thin, and needless to say even more so in the case of a relatively thick specimen. The reason for this being: (1) the electron microscope is subject to several aberrations which are impossible to compensate for, since the usual electron microscope is provided with only converging lens, (2) the aberrations become abruptly noticeable when the converging lenses are used with low gain in magnification, and (3) the amount of inelastic scattering electrons increases with the increment thickness of the speciment to be examined. Further, the scattering angles thereof increase so that the circumferential portion of the image focused on the photographic plate is blurred. Therefore, the image photographed with low magnification has a satisfactory definition only at its center portion. Furthermore, with the conventional electron microscope, divergence of the electron beam is limited by the pole pieces of the electron lenses or diameter of a fixed aperture, so that only a small portion of the object can be photographed at the same time even if the magnification is lowered to a considerable extent. Therefore, in order to obtain a photograph of a wide field range of object while maintaining satisfactory quality, it has been necessary to assemble or neighbor a plurality of photographs of somewhat high magnification. Such a case, however, requires a tremendous amount of cumbersome work, and encounters an additional problem that the plurality of photographs can not be assembled precisely due to distortion of the electron lenses as well as the shrinkage and/or expansion of photographic paper.

It is therefore an object of this invention to provide a method of photographing images of different portions of a single photographic plate using an electron microscope, and apparatus therefor, by which a high and uniform quality, wide field of view image of low magnification can be recorded on the single photographic plate.

SUMMARY OF THE INVENTION

According to one aspect of this invention, a method of photographing electron microscope images of different portions of a specimen on corresponding portions of a single photographic plate, comprises: selecting a portion of said specimen; selecting a portion of a photographic plate, which portion corresponds to the selected portion of the specimen and on which portion the selected portion of said specimen is imaged; exposing an electron beam, emerging from the selected portion of said specimen, to the selected portion of said photographic plate; and repeating the above steps, whereby the images of the different portions of said specimen are photographed on corresponding portions of said single photographic plate.

According to the other aspect of this invention, apparatus for photographing electron microscope images of different portions of a specimen on different portions of a single photographic plate, comprises: an objective lens; first means for selecting a portion of said specimen, which means is provided in the vicinity of said objective lens; a shutter provided between said objective lens and said photographic plate; second means for selecting a portion of said photographic plate, which portion corresponds to the selected portion of said specimen and on which portion the selected portion of said specimen is imaged; and control means electrically connected to said first and second means and said shutter for controlling their operation.

BRIEF DESCRIPTION OF THE DRAWINGS

This and other objects, features and many of the attendant advantages of this invention will be appreciated more readily as the same becomes better understood by reference to the following detailed description, when considered in connection with the accompanying drawings, wherein like parts in each of the several figures are identified by the same reference characters, and wherein.

DETAILED DESCRIPTION OF THIS INVENTION

Figure 1:
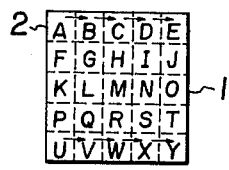
FIG. 1 is a plan view of a specimen which is arbitrarily divided into a plurality of portions for explanation of this invention.
Figure 2:
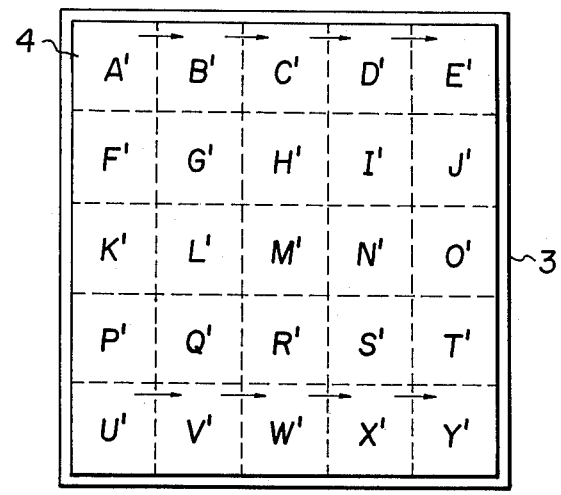
FIG. 2 is a plan view of a photographic plate, for explanation of this invention, having a plurality of portions on which corresponding portions of the specimen are imaged.

The invention will be described by way of example with reference to the accompanying drawings. First, in connection with FIG. 1, the principle of the method of photographing different portions of a specimen on corresponding portions of a single photographic plate using an electron microscope is discussed. It is firstly necessary to select a portion, as a section to be observed or examined, of a given specimen fixedly mounted on a specimen stage. The portion to be examined can be selected by mechanically moving the specimen stage in a plane perpendicular to the longitudinal axis of the electron microscope. As an alternative, the portion can be selected, without any mechanical movement of the specimen stage, by deflecting the electron beam which has passed through the selected portion but which does not include the axis of an objective lens. In this case, the electron beam is so deflected as to travel on or near the axis of an electron lens next to the objective lens. FIG. 1 shows a specimen 1 divided into a plurality of portions 2, which are to be separately observed and conveniently labelled A through Y as shown. As the portions 2 are selected individually for observation in, for example, alphabetical order, the final images thereof are caused to form on corresponding portions 4 of a single photographic plate 3 in the order of primed alphabets, as shown in FIG. 2. It is as a matter of course that the size of each image 4 on the plate 3 is smaller than that of the latter. Selecting the portions 4 is carried out by deflecting the electron beam impinging on the photographic plate 3, or alternatively by mechanically and intermittently moving the plate 3. It is thus understood that the different portions 2 of the specimen 1 can be formed and then recorded on the corresponding portions 4 of the photographic plate 3, thereby a photographic image with a wide field of view can be attained.

Figure 3:
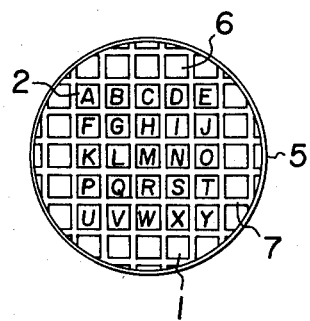
FIG. 3 is a plan view of a specimen on which a grid is placed according to this invention.

In FIG. 3, a grid 5 is placed on the specimen 1, and apertures of the grid 5 define respectively the portions 2 each to be observed separately. The portions 2 are selected, for example, in alphabetical order as referred to in connection with FIG. 1. With this arrangement, a metalic frame 7 of the nature blocking an electron beam serves to clearly define the peripheries of the portions 2 as well as those of the images formed on the plate 3. As a result, the grid 5 enables the neighboring or assembling of the images on the plate 3 to be easy, so that, as compared with the absence of the grid 5, high precision is no longer required in neighboring the final images and hence this arrangement is practically suitable. Although each of the apertures 6 of the grid 5 has a square configuration in FIG. 3, it is not restricted thereto and may be rectangular, hexagonal or octagonal, for example.

Figure 4:
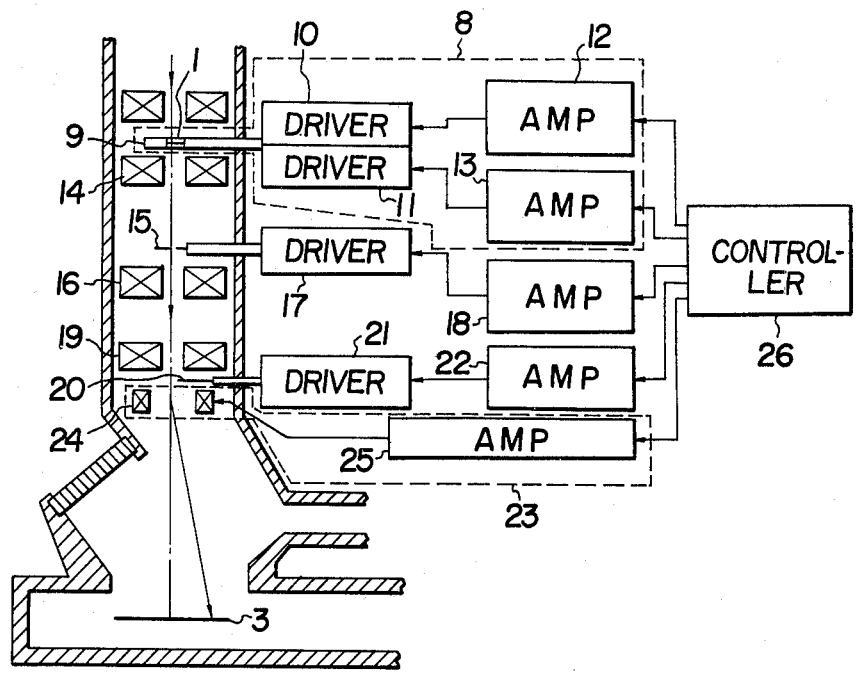
FIG. 4 is a simplified sectional view of part of an electron microscope and associated electrical devices in block diagram form, of a first embodiment of this invention.
Figure 5:
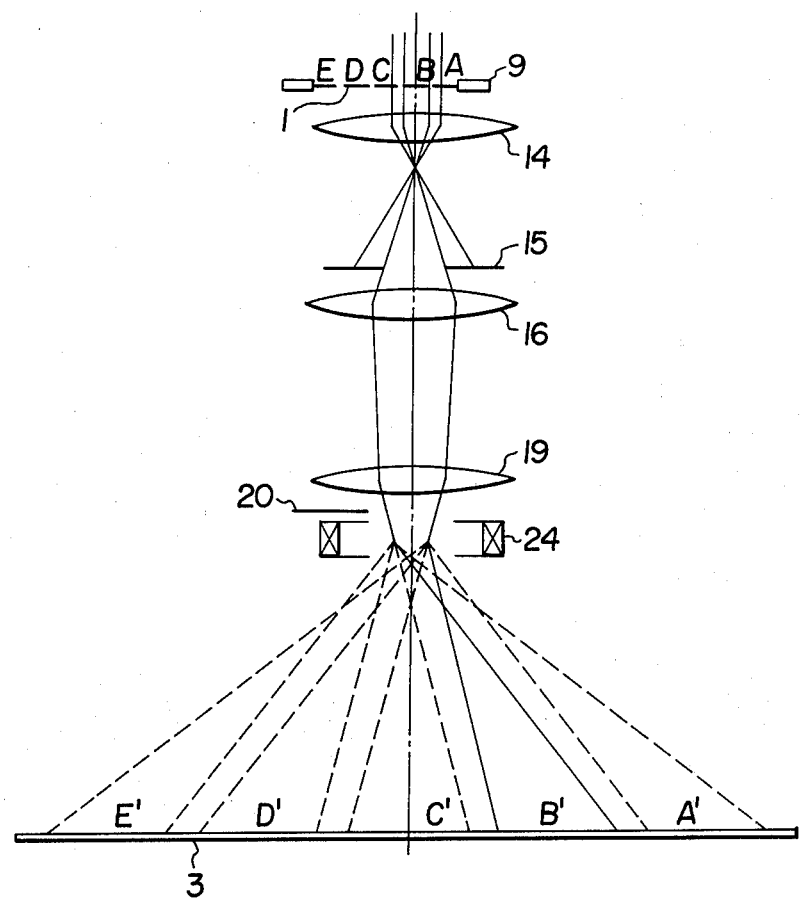
FIG. 5 is a schematic optical analogy of the part of the electron microscope shown in FIG. 4.

Referring now to FIGS. 4 and 5, wherein a first embodiment of this invention is schematically illustrated. A selector 8 comprises a specimen stage 9 for displacing the specimen 1, two drivers 10 and 11, and two amplifiers 12 and 13. The drivers 10 and 11 moves the specimen stage 9 under control such as to be parallel with two orthogonal axes in a plane normal to the longitudinal axis of the microscope, and then brings the portion 2 (FIGS. 1 and 3), to be observed, into a position perpendicular to the axis of an objective lens 14. FIG. 5 shows a condition where the portion B is selected. As previously described, the positioning or neighboring of the images on the plate 3 becomes easier with the grid 5.

A field view limiting aperture 15 which operates as an electron regulation means is provided under the objective lens 14 and allows only the electron beam, emerging from or passing through the portion B (FIG. 5), to travel through the intermediate lens 16 and projector lens 19. Then, the electron beam from the aperture 15 passes through an intermediate lens 16. The aperture 15 serves the purpose of precisely neighboring the images formed on the plate 3 by limiting each field view of the images. The aperture 15 is inserted into or withdrawn from a position normal to the axis of the microscope by means of an associated driver 17 which is energized by a an amplifier 18. However, an an alternative, the aperture 15 can be operated manually and positioned in front of a projector lens 19. The configuration of the aperture 15 should be in analogy with that of the aperture 6 of the grid 5, which may be rectangular, hexagonal or octagonal, for example. Conversely, if the electron beam incident on the specimen 1 is adjusted in diameter and cross-sectional configuration so as to match the shape of each portion 2, then the aperture 15 can be omitted as the field view in question can be desirably limited without a provision of an aperture.

The projector lens 19, which is provided under the intermediate lens 16, is to focus a magnified final image on the photographic plate 3.

A shutter 20 is provided under the projector lens 19 and opens and closes, in a position normal to the axis of the microscope, by means of an associated driver 21 thereof which is energized by an amplifier 22. The shutter 20 is not necessarily provided under the projector lens 19, but may be provided in any position if in front of the plate 3.

A selector 23 comprises an amplifier 25 and an electron beam deflecting means 24 which is provided under the shutter 20 and includes two pairs of orthogonal deflectors although only one pair is shown in FIGS. 4 and 5. The selector 23 is to control the direction of the electron beam such as to selectively impinge on the portions of the photographic plate 3, as schematically shown in FIG. 5. The adjustment of the travelling direction of the electron beam is implemented by controlling currents or voltage applied to the deflecting means 24 from the amplifier 25. Although the deflecting means 24 is provided under the shutter 20 in this particular embodiment, it can be provided in any position between the view field limiting aperture 15 and the plate 3.

A controller 26 is electrically connected to the amplifiers 12, 13, 18, 22 and 25, and amplifies the control signals applied to the drivers 10, 11, 17, 21 and the deflection means 24, respectively, in order to properly photograph the images of different portions of the specimen 1 on the corresponding portions on the plate 3. More specifically, the drivers 10, 11, under the control of the controller 26, adjusts the horizontal positions of the specimen stage 9 for selecting in order the portions A through Y of the specimen 1. The controller 26 controls the driver 17 through the amplifier 18, and causes the field view limiting aperture 15 to be inserted into and withdrawn from the preset position. On the other hand, the driver 21 makes the shutter 20 open and close under the control of the controller 26 as the portions A through Y are selected one by one. While, the deflection means 24 under the control of the controller 26 establishes different electron paths toward the selected portions of the photographic plate 3.

Figure 6:
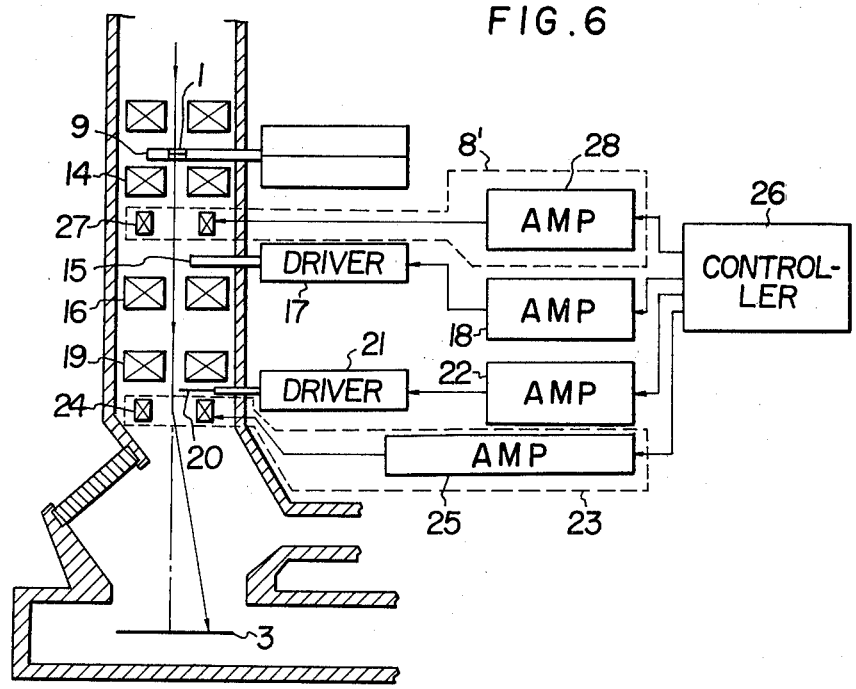
FIG. 6 is a simplified sectional view of part of an electron microscope and associated electrical devices in block diagram form, of a second embodiment of this invention.
Figure 7:
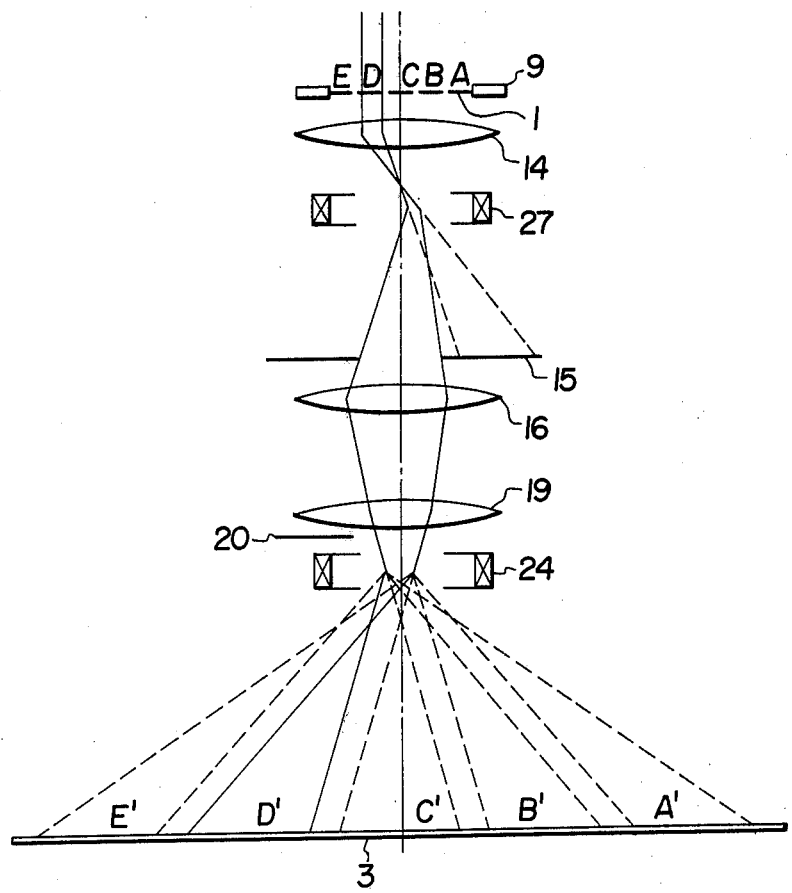
FIG. 7 is a schematic optical analogy of the part of the electron microscope shown in FIG. 6.

Reference is now made to FIGS. 6 and 7, wherein the second embodiment of this invention is schematically illustrated. This embodiment is similar to the first one, except that the specimen stage 9 is fixed and the portions of the specimen 1 are separately selected by allowing the electron beam passing through the particular portion, to be examined, to proceed on or very near the axis of the microscope, thereby including therein said axis in the former. To this end, a selector 8', comprising an amplifier 28 and an electron beam deflection means 27, is provided between the object lens 14 and the intermediate lens 16. The deflection means 27 consists of two pairs of orthogonal deflectors, operates as an electron regulation means, although only one pair is shown in FIGS. 6 and 7. More specifically, the deflection means 27 is supplied with currents or voltages from the amplifier 28 under the control of the controller 26, and then deflects the electron beam, emerging from the selected portion (in FIG. 7, the portion D) and which does not include therein the axis of the objective lens 14, in such a manner as to travel on or very near the axis of the intermediate lens 16. Inasmuch as the specimen stage 9 is fixedly positioned in this embodiment, positioning errors of the specimen arising from the mechanical movement of the stage 9 and also the unwanted drifting of the specimen 1 due to the breaking of thermal equilibrium can advantageously be prevented. Therefore, the final images formed on the plate 3 are photographed stably and precisely. The electron beam deflection means 27 is not necessarily provided as shown in FIGS. 6 and 7, and may alternatively be positioned between the intermediate lens 16 and the projector lens 19. The other elements of the second embodiment is the same as those of the first (FIGS. 4 and 5), so that further description will be omitted for brevity.

Figure 8:
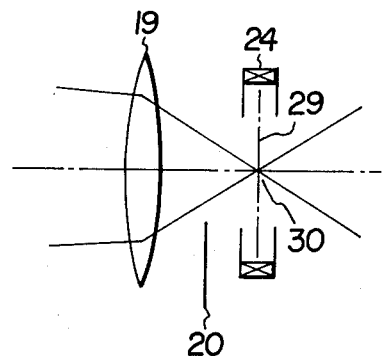
FIG. 8 is an optical representation of a modification of a part of the first or second embodiment.

FIG. 8 shows a preferable positioning of the deflection means 24 relative to the projector lens 19, which is highly advantageous in the first and the second embodiments of this invention. The deflection means 24 is so provided that the main deflection plane 29 is at a position 30 where the cross-section area of the electron beam from the projector lens 19 is substantially the smallest value. As a result, the electron beam is uniformly deflected in that the cross-sectional area is very small at the main deflection plane 29. This means that the final images on the plate 3 is not subject to distortion of deflection with attendant image formation of high precision.

Each of the above described embodiments of this invention uses a three stage electron lens system, viz, the objective lens 14, the intermediate lens 16 and the projector lens 19. However, this invention is not limited to the three stage type electron microscope and may be of a two stage type with the exclusion of the intermediate lens 16, or, of four or more stage type with two or more intermediate lenses in addition to the objective lens 14 and the projector lens 19.

The method of individually photographing the final images formed on the plate 3 will be discussed, by way of example, in more detail. Firstly, the field view limiting aperture 15 is controlled by the controller 26 and set in a position predetermined and normal to the axis of the instrument, and once initially positioned, usually retained therein until the photographing is completed. The aperture 15, however, may alternatively be positioned manually. Then, the shutter 20 closes in response to the control signal from the controller 26, and the photographic plate or film 3 is loaded in a preset position. In the latter case, if a photo-loading device (not shown) of a photographic plate (not shown) is designed to be controlled by the controller 26, the loading of the plate 3 can be automated. Following, the portion A of the specimen 1 is selected: by moving the specimen stage 9 so as to center the portion A with the axis of the objective lens 14 in the case of the first embodiment (FIGS. 4 and 5), or by bending the electron beam, under the control of the controller 26, in a manner to include therein the axis of the intermediate lens 16 in the case of the second embodiment (FIGS. 6 and 7). The deflection means 24 of the selector 23 is energized or magnetized, under the control of the controller 26, such that the electron beam passing through the deflection means 24 is directed to impinge on the portion A' of the plate 3. After these steps, the controller 26 opens the shutter 20, through the power supply 18 and the driver 17, for a time sufficient to attain proper photographic density on the portion A', and thereafter closes the shutter 20. The image of the portion A is thus photographed on the corresponding portion A' of the plate 3. Then, the next portion B is selected and the above steps are repeated until the final portion Y is imaged and photographed on its corresponding portion Y' of the plate 3. Thereafter, the plate 3 is accommodated in the photographic plate container (not shown) while closing the shutter 20.

It is understood from the foregoing that even if the field of view of specimen 1 is small (for example, $40\mu \times 40\mu$), the entire relatively wide specimen (for example, an area of 9 mm$^2$–25 mm$^2$) can be photographed on a single photographic plate 3 by correspondingly changing the portions of the specimen 1 and the plate 3. The electron beam impinging on the intermediate lens 16 as well as the projector lens 19 is limited to be very near or include the longitudinal axis of the microscope, so that various aberrations arising from these lenses can be reduced considerably with great increase of photographic quality. Furthermore, when the deflection means 27 is employed for selecting the portions of the specimen 1, the unwanted drift of the specimen 1 can be removed with attendant high quality of photography. Still furthermore, when the main deflection plane of the projector lens 24 is positioned where the cross-sectional area of the electron beam is the smallest or close to said value, the aberration of deflection can be reduced to a considerable extent with the result of image formation of high precision.

What is claimed is:

1. A method of photographing electron microscope images of different portions of a specimen included in the view of the observation, one after another, on corresponding portions of a single photographic plate, which method comprises the steps of:

selecting a portion of said specimen as a section of observation, and obtaining only the electron beam which emerges from said selected portion of the specimen;

applying the electron beam emerging from the selected portion of said specimen to an intermediate lens and a projector lens, on or near the axis thereof;

selecting a portion of the photographic plate as a sectional position of exposure which corresponds to the position relative to the view of the observation where said selected portion of the specimen should be imaged, and deflecting the electron beam passed through the intermediate lens and projector lens at a position between the projector lens and the photographic plate to said selected portion of the photographic plate;

exposing the electron beam emerging from said selected portion of said specimen to said selected portion of the photographic plate; and repeating the above steps by selecting other portions of the specimen different from said portion, one after another, applying the electron beam emerging from a selected other portion of said specimen to the intermediate lens and the projector lens, deflecting the electron beam passed through the intermediate lens and the projector lens at the position between the projector lens and the photographic plate to another selected portion of the same photographic plate as that used in the former exposing step, and exposing the deflected electron beam.

2. A method as claimed in claim 1, wherein said selected portion of the specimen corresponds to a portion defined by an aperture of a grid for holding said specimen.

3. A method as claimed in claim 1 or 2, wherein the portion of said specimen to be observed is selected by moving the specimen in a plane perpendicular to the longitudinal axis of the microscope.

4. A method as claimed in claim 1 or 2, wherein the portion of said specimen to be observed is selected by deflecting the electron beam applied to the specimen.

5. An apparatus for photographing electron microscope images of different portions of a specimen on the portions of a single photographic plate which correspond to the positions where said portions of a specimen should be imaged respectively, comprising:
   an objective lens;
   an intermediate lens positioned under said objective lens;
   a projector lens positioned under said intermediate lens;
   a photographic plate positioned under said projector lens;
   a specimen stage disposed in said objective lens;
   a selector means provided in the vicinity of said objective lens for selecting a portion of said specimen as a section of observation, one after another;
   a regulation means for regulating the electron beam to apply toward said selected portion of the specimen, and to travel on or near the axis of said intermediate lens and projector lens;
   a deflection means positioned between said projector lens and the photographic plate for deflecting the electron beam passed through the intermediate lens and projector lens toward each portion of said photographic plate corresponding to each selected portion of said specimen, on which each of said portions of a specimen should be imaged;
   a shutter provided between said objective lens and said photographic plate for exposing multiple images of the different portions of the specimen on the different portions of one photographic plate; and
   control means electrically connected to said selector means, deflection means and shutter for controlling their operations.

6. An apparatus as claimed in claim 5, wherein said selector means comprises drive means connected to the specimen stage which adjusts the position of said specimen by displacing said specimen stage in a plane perpendicular to the axis of said objective lens in order to bring the selected portion of said specimen on or near said axis.

7. An apparatus as claimed in claim 5, wherein said selector means comprises scanner means for scanning the electron beam.

8. An apparatus as claimed in claim 5, 6 or 7, wherein said regulation means comprises an aperture means provided between said objective lens and projector lens which allows only the electron beam emerging from the selected portion of the specimen to travel through the intermediate lens and projector lens on or near the axis thereof.

9. An apparatus as claimed in claim 5, 6 or 7, wherein said regulation means comprises a member which makes and applies an electron beam spot on the specimen.

* * * * *